(12) United States Patent
Kasai

(10) Patent No.: US 6,269,019 B1
(45) Date of Patent: Jul. 31, 2001

(54) FERROELECTRIC MEMORY DEVICE CAPABLE OF ADJUSTING BIT LINE CAPACITANCE

(75) Inventor: Masanori Kasai, Tokyo (JP)

(73) Assignee: Oki Electric Industry, Co., Ltd. (JP)

( * ) Notice: Subject to any disclaimer, the term of this patent is extended or adjusted under 35 U.S.C. 154(b) by 0 days.

(21) Appl. No.: 09/691,885

(22) Filed: Oct. 20, 2000

(30) Foreign Application Priority Data

Oct. 21, 1999 (JP) .................................................. 11-299400

(51) Int. Cl.[7] .................................................. G11C 11/22
(52) U.S. Cl. .................... 365/145; 365/207; 365/190; 365/225.7
(58) Field of Search ................................. 365/145, 225.7, 365/207, 190

(56) References Cited

U.S. PATENT DOCUMENTS

| | | | |
|---|---|---|---|
| 5,309,391 | * 5/1994 | Papaliolios | .......................... 365/145 |
| 5,524,092 | * 6/1996 | Park | ..................................... 365/145 |
| 5,689,456 | * 11/1997 | Kobayashi | ........................... 365/145 |
| 5,936,879 | * 8/1999 | Brouwer et al. | ..................... 365/145 |
| 6,178,107 | * 1/2001 | Kang | .................................... 365/145 |

OTHER PUBLICATIONS

"Low–power High–speed LSI Circuits & Technology", pp. 234–236, Realize Co., Jan. 31, 1998.

* cited by examiner

Primary Examiner—Andrew Q. Tran
(74) Attorney, Agent, or Firm—Venable; James R. Burdett

(57) ABSTRACT

Bit line capacitance variation devices are respectively connected to the bit lines contained in a ferroelectric memory device. These bit line capacitance variation devices change the capacitance of bit lines according to the bit line potential during operations for reading data from the ferroelectric memory device.

11 Claims, 16 Drawing Sheets

PRIOR ART

FERROELECTRIC MEMORY DEVICE CAPABLE OF ADJUSTING BIT LINE CAPACITANCE

BACKGROUND OF THE INVENTION

1. Field of the Invention

This invention concerns a ferroelectric memory device which utilizes the polarization of ferroelectric material.

2. Description of Related Art

FIG. 14 is a circuit diagram showing the configuration of ferroelectric memory (FeRAM) devices of the prior art. In FIG. 14, the structure of an ordinary FeRAM memory array is shown. This FeRAM device comprises a plurality of word lines WL0 to WL3, a plurality of plate lines PL0 and PL1, and a plurality of bit lines BL0 to BL3. A memory cell is connected to each of these lines. Further, the FeRAM device comprises a sense amplifier 10. Each of the bit lines BL0 to BL3 is connected to this sense amplifier 10. This sense amplifier 10 operates according to a sense amplifier activation signal SAE.

The memory cell M0 contained in the FeRAM device comprises the selection transistor T0 and ferroelectric capacitor C0; similarly, the memory cell M1 comprises the selection transistor T1 and ferroelectric capacitor C1. In general, NMOS transistors are used as the selection transistors. The main current path (channel) of this selection transistor T0 and the ferroelectric capacitor C0 are connected in series between the bit line BL0 and the plate line PL0, in order from the side of the bit line BL0, and the control electrode (gate electrode) of the selection transistor T0 is connected to the word line WL0. The main current path of the selection transistor T1 and the ferroelectric capacitor C1 are connected in series between the bit line BL1 and the plate line PL0, in order from the side of the bit line BL1, and the control electrode of the selection transistor T1 is connected to the word line WL1.

The FeRAM device further comprises a floating control line EQ0 and transistors T4 and T5 for floating control. The main current paths of each of these transistors T4 and T5 are connected in series between the bit lines BL0 and BL1. The point of connection between these main current paths is connected to a ground terminal GND. Each of the control electrodes of the transistors T4 and T5 is connected to the control line EQ0.

Reading of data from such a FeRAM device is generally performed in conformance with the method described in the publication "Low-Power High-Speed LSI Circuits & Technology", pp. 234–236, published by Realize Inc. FIG. 15 is a timing chart showing the data readout operation in a conventional FeRAM device. Below, this readout operation is explained with reference to FIG. 15. In FIG. 15, the symbol "L" signifies ground potential, and the symbol "H" signifies the power supply voltage (Vcc).

At time t1, the floating control line EQ0 is set to level "L", and the bit lines BL0 and BL1 are put in a floating state. Next, at time t2, a voltage VH is applied to the word lines WL0 and WL1, and the gates of the selection transistors T0 and T1 open. The applied voltage VH is higher than the power supply voltage Vcc by an amount equal to the threshold voltage Vt of the selection transistors.

Next, at time t3, the plate line PL0 is set to "H". Read potentials occur on the bit lines BL0 and BL1, via the ferroelectric capacitors C0 and C1 respectively. The capacitances of the capacitors C0 and C1 differ depending on the polarization direction, and so the read potentials occurring on the bit lines BL0 and BL1 differ according to the respective polarization directions.

Next, at time t4, the sense amplifier activation signal SAE is set to "H", and the sense amplifier 10 is activated. The sense amplifier 10 detects the difference in the read potentials occurring on the bit lines BL0 and BL1, and amplifies the potentials to ground potential and to the power supply potential Vcc respectively. These potentials correspond to a logical "0" and "1" respectively after reading.

FIG. 16 is a graph showing the relation between charge in a ferroelectric capacitor and applied voltage. In the graph, the voltage V applied to the ferroelectric capacitor is plotted along the horizontal axis, and the charge Q on the ferroelectric capacitor is plotted along the vertical axis. On the graph, the curve a represents the change in charge when data "1" is read, that is, the capacitance Cf1 of the ferroelectric capacitor when data "1" is stored. The curve b represents the change in charge when data "0" is read, that is, the capacitance Cf0 of the ferroelectric capacitor when data "0" is stored. The straight line c represents the load line; its gradient is determined by the value of the bit line capacitance Cb. The load line c and the horizontal axis intersect at the power supply voltage Vcc. The difference V1 between the voltage at the point of intersection of the load line c and curve a, and the power supply voltage Vcc, corresponds to the bit line potential when data "1" is read out. The difference V0 between the voltage at the point of intersection of the load line c and curve b, and the power supply voltage Vcc, corresponds to the bit line potential when data "0" is read out. It is necessary that the difference ΔV between these bit line potentials V1 and V0 be equal to or greater than the discrimination sensitivity of the sense amplifier.

However, the hysteresis characteristics of ferroelectric capacitors are greatly affected by device fabrication processes, and characteristic degradation occurs readily. As shown in FIG. 16, the capacitances Cf1 and Cf0 of ferroelectric capacitors which have undergone characteristic degradation are reduced, becoming the capacitance Cf1' indicated by the curve a' and the capacitance Cf0' indicated by the curve b', respectively. As a result, the difference V1' between the voltage at the intersection of the load line c and curve a', and the power supply voltage Vcc, is reduced compared with V1. Further, the difference V0' between the voltage at the intersection of the load line c and curve b', and the power supply voltage Vcc, is reduced compared with V0. In particular, due to the properties of ferroelectric materials, there are large fluctuations in the readout potential V1 during reversal. Hence the difference ΔV' between these bit line potentials V1' and V0' is also reduced compared with the original ΔV. This reduction in ΔV means that there is a reduction in the sense margin (the readout margin), and is a direct cause of read errors.

Hence a ferroelectric memory device having a large readout margin has long been sought.

SUMMARY OF THE INVENTION

The ferroelectric memory device of this invention comprises a plurality of word lines, a plurality of plate lines, a plurality of bit lines, a bit line capacitance variation device which changes a bit line capacitance according to the bit line potential, and a plurality of memory cells; these memory cells comprise a ferroelectric capacitor and a selection transistor.

In a ferroelectric memory device of this invention, it is preferable that the main current path of a selection transistor and a ferroelectric capacitor be connected in series between a bit line and a plate line, in order from the bit line side, and that the control electrode of the selection transistor be connected to a word line.

FIG. 1 is a circuit diagram showing one example of a ferroelectric memory (FeRAM) device of this invention. In FIG. 1, the configuration of the principal parts of the FeRAM device is shown; parts of the word lines, plate lines, bit lines, memory cells, and other components are omitted. The FeRAM device shown in FIG. 1 comprises a plurality of word lines WL0 to WL3, a plurality of plate lines PL0 and PL1, and a plurality of bit lines BL0 to BL3. Memory cells are connected to each of these lines. The FeRAM device also comprises a sense amplifier 10. Each of the bit lines BL0 to BL3 is connected to this sense amplifier 10. This sense amplifier 10 operates according to the sense amplifier activation signal SAE.

The memory cell M0 contained in the FeRAM device comprises a selection transistor T0 and ferroelectric capacitor C0; similarly, the memory cell M1 comprises a selection transistor T1 and ferroelectric capacitor C1. The main current path (channel) of this selection transistor T0 and the ferroelectric capacitor C0 are connected in series between the bit line BL0 and plate line PL0, in order from the side of the bit line BL0; the control electrode (gate electrode) of the selection transistor T0 is connected to the word line WL0. The main current path of the selection transistor T1 and the ferroelectric capacitor C1 are connected in series between the bit line BL1 and plate line PL0, in order from the side of the bit line BL1; the control electrode of the selection transistor T1 is connected to the word line WL1. NMOS transistors are used as these selection transistors T0 and T1.

The FeRAM device further comprises a floating control line EQ0 and transistors T4 and T5 for floating control. The main current paths of each of these transistors T4 and T5 are connected in series between the bit lines BL0 and BL1. The point of connection between these main current paths is connected to a ground terminal GND. Each of the control electrodes of the transistors T4 and T5 is connected to the control line EQ0.

Each of the bit lines BL0 to BL3 is connected to the respective bit line capacitance variation devices 12a, 12b, 12c, and 12d. These bit line capacitance variation devices 12a through 12d vary the bit line capacitance according to the bit line potential.

Next, data reading from the FeRAM device of this invention is explained with reference to FIG. 2. FIG. 2 is a timing chart showing data readout operation in the FeRAM device of this invention. In FIG. 2, the symbol "L" signifies ground potential, and the symbol "H" signifies the power supply voltage (Vcc).

At time t1, the floating control line EQ0 is set to level "L", and the bit lines BL0 and BL1 are put in a floating state.

Next, at time t2, a voltage VH is applied to the word lines WL0 and WL1, and the gates of the selection transistors T0 and T1 open. The applied voltage VH is higher than the power supply voltage Vcc by an amount equal to the threshold voltage Vt of the selection transistors.

Next, at time t3, the plate line PL0 is set to "H", causing read potentials to occur on the bit lines BL0 and BL1, via the ferroelectric capacitors C0 and C1 respectively. The capacitances of the capacitors C0 and C1 differ depending on the polarization direction, and so the read potentials occurring on the bit lines BL0 and BL1 assume values V0 or V1 according to the respective polarization directions. In response to these potentials, the bit line capacitance variation devices 12a and 12b, connected to the bit lines BL0 and BL1, operate as shown in FIG. 3.

FIG. 3 is a graph serving to explain the operation of the bit line capacitance variation devices. In the graph, the voltage applied to the ferroelectric capacitor is plotted along the horizontal axis, and the charge Q on the ferroelectric capacitor is plotted along the vertical axis. In the graph, the curve a represents the change in charge when data "1" is read, that is, the capacitance Cf1 of the ferroelectric capacitor when data "1" is stored. The curve b represents the change in charge when data "0" is read, that is, the capacitance Cf0 of the ferroelectric capacitor when data "0" is stored. The straight line c represents the load line; its gradient is determined by the value of the bit line capacitance Cb. The load line c and the horizontal axis intersect at the power supply voltage Vcc. The difference V1 between the voltage at the point of intersection of the load line c and curve a, and the power supply voltage Vcc, corresponds to the bit line potential when data "1" is read out. The difference V0 between the voltage at the point of intersection of the load line c and curve b, and the power supply voltage Vcc, corresponds to the bit line potential when data "0" is read out.

For example, when a readout voltage V0 occurs on bit line BL0, the bit line capacitance variation device 12a increases the bit line capacitance Cb of the bit line BL0 to Cb0 (the gradient of the straight line d in FIG. 3). As a result, the read potential V0 is reduced to V0' (the difference between the potential at the intersection of the curve b and straight line d in FIG. 3, and the power supply voltage Vcc). When a readout potential V1 occurs on bit line BL1, the bit line capacitance variation device 12b decreases the bit line capacitance Cb of the bit line BL1 to Cb1 (the gradient of the straight line e in FIG. 3). As a result, the read potential V1 is increased to V1' (the difference between the potential at the intersection of the curve a and straight line e in FIG. 3, and the power supply voltage Vcc). Hence the difference $\Delta V'$ between these readout potentials (the difference between V1' and V0') is increased compared with the difference $\Delta V$ in readout potentials for the case in which no bit line capacitance variation devices are provided (the difference between V1 and V0), and so the read margin is increased.

Next, at time t4, the sense amplifier activation signal SAE is set to "H", and the sense amplifier 10 is activated. The sense amplifier 10 detects the difference in the read potentials occurring on the bit lines BL0 and BL1, and amplifies the potentials to ground potential and to the power supply potential Vcc respectively. These potentials correspond to a logical "0" and "1" respectively after reading.

In this way, by changing the bit line capacitance using a bit line capacitance variation device, the read margin is increased. As a result, read errors are decreased.

In the ferroelectric memory device of this invention, it is suitable to have the bit line capacitance variation devices each be a PMOS transistor with gate electrode connected to the bit line, used as a P-type MOS capacitor.

In the ferroelectric memory device of this invention, it is preferable that the bit line capacitance variation devices are each constituted from either one or a plurality of variable elements; these variable elements may each be constituted from a switch connected to the bit line, and a PMOS transistor with gate electrode connected to the bit line via the switch and used as a P-type MOS capacitor.

By means of such a configuration, the number of variable elements used can be selected, and so fine adjustment of the bit line capacitance is possible.

The above-mentioned switches may be configured from CMOS transfer gates.

The above-mentioned switches may be configured from metal fuses.

In the ferroelectric memory device of this invention, it is suitable to have the bit line capacitance variation devices each be an NMOS transistor with gate electrode connected to the bit line, used as an N-type MOS capacitor.

In this way, NMOS transistors similar to the selection transistors and other memory transistors are used, so that the well and substrate can be used in common, and extra area for well separation is unnecessary.

In the ferroelectric memory device of this invention, it is preferable that the bit line capacitance variation devices are each constituted from either one or a plurality of variable elements; these variable elements may each constitute a switch connected to the bit line, and an NMOS transistor with gate electrode connected to the bit line via the switch and used as an N-type MOS capacitor.

The above-mentioned switches may be configured from CMOS transfer gates.

The above-mentioned switches may be configured from metal fuses.

DESCRIPTION OF THE PREFERRED EMBODIMENTS

Below, embodiments of the present invention are described with reference to the drawings. The drawings are no more than abridged diagrams showing connections and other information sufficient to enable understanding of the invention. Hence this invention is not limited to the examples of the drawings.

First Embodiment

Figure 1:
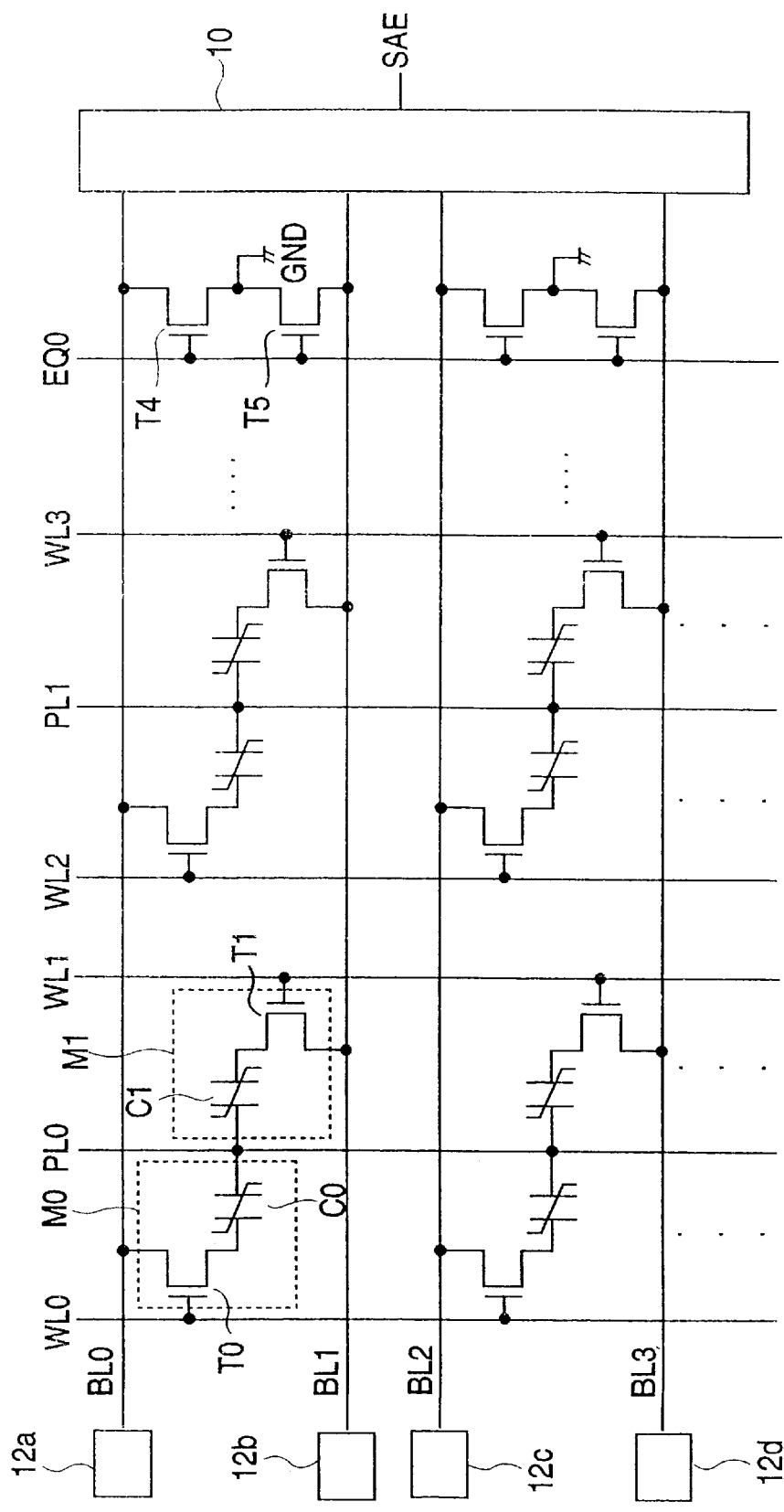
FIG. 1 is a drawing showing the configuration of a ferroelectric memory device of this invention.
Figure 2:
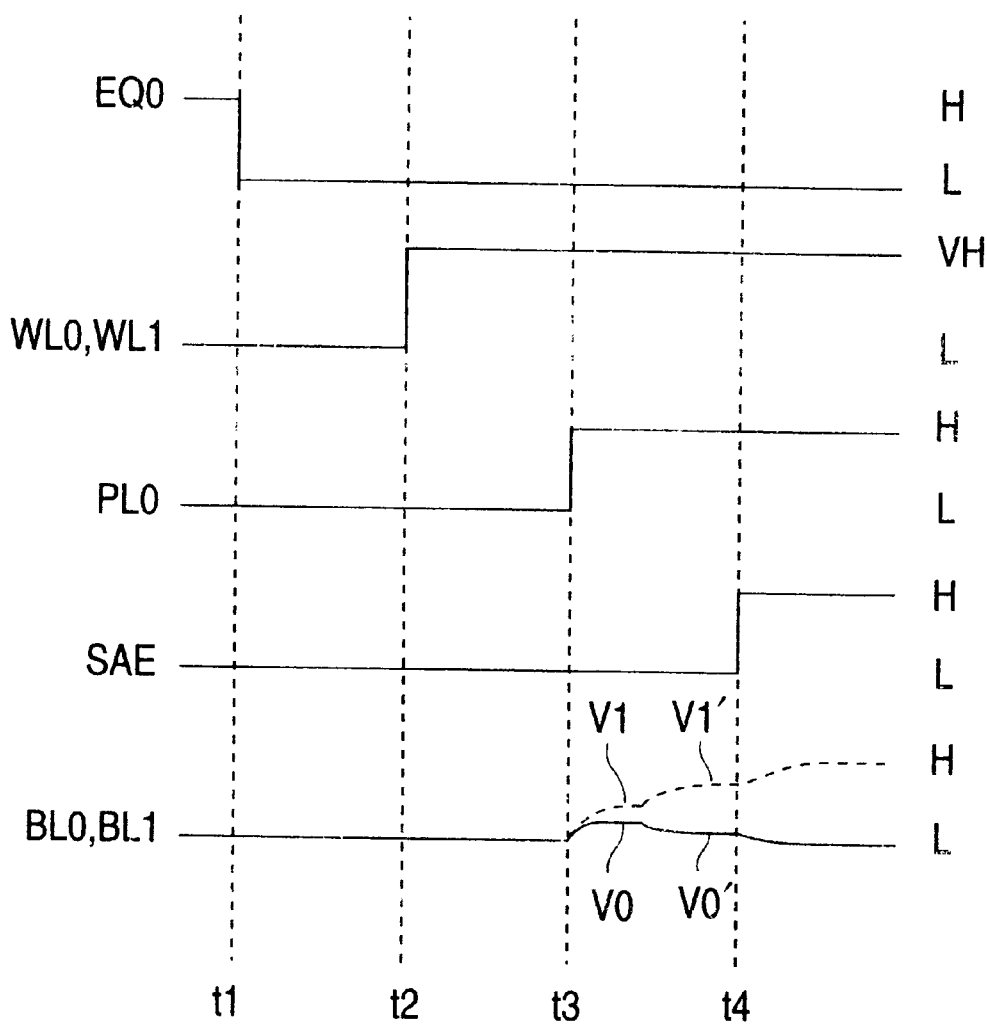
FIG. 2 is a drawing showing data readout operation of the ferroelectric memory device of this invention.
Figure 3:
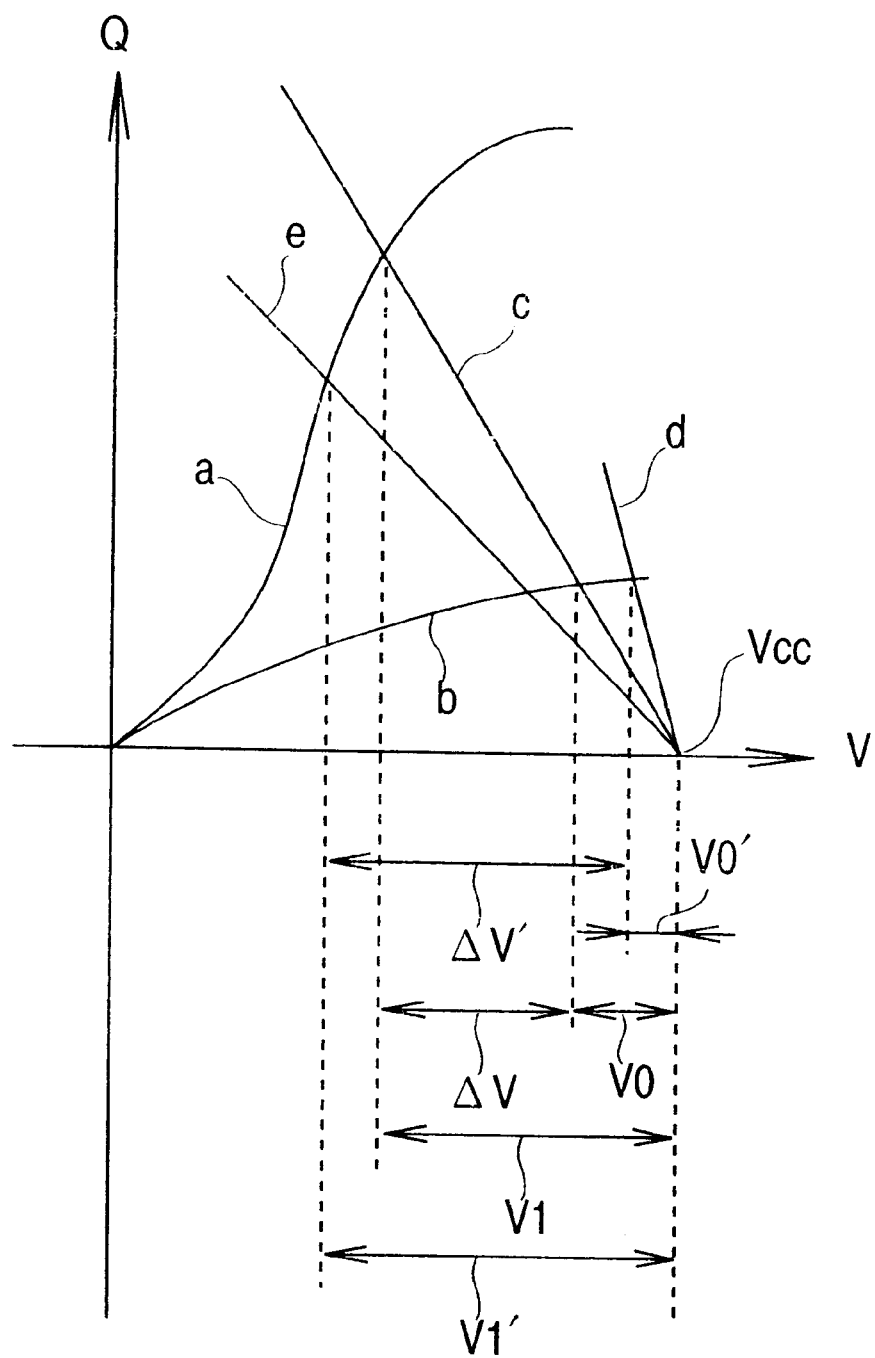
FIG. 3 is a graph serving to explain operation of the bit line capacitance variation devices.
Figure 4:
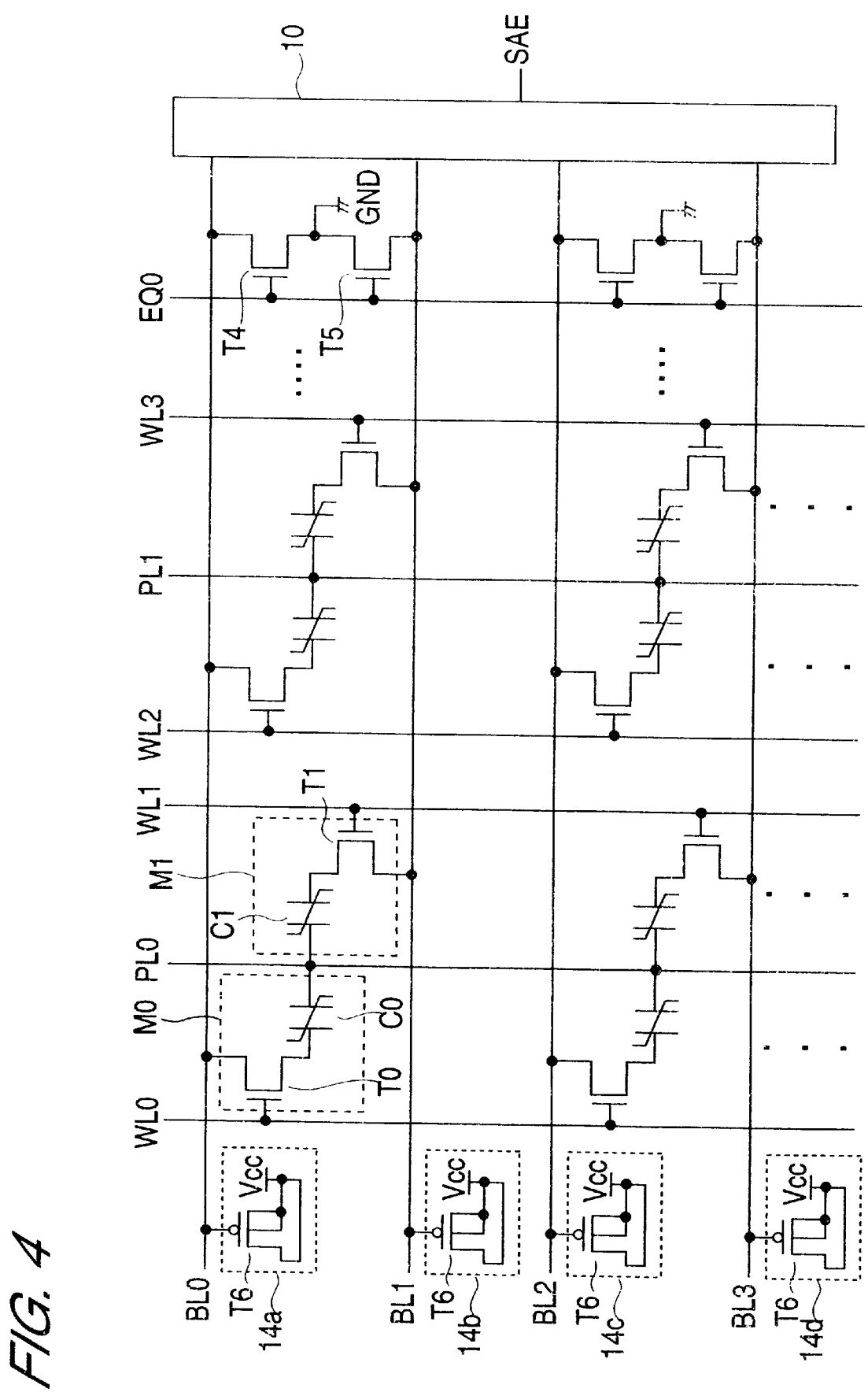
FIG. 4 is a drawing showing the configuration of a ferroelectric memory device according to a first embodiment of this invention.

FIG. 4 is a circuit diagram showing the configuration of a ferroelectric memory (FeRAM) device according to a first embodiment. In FIG. 4, the configuration of the principal components of the FeRAM device is shown. In FIG. 4, some of the word lines, plate lines, bit lines, memory cells, and other components are omitted. The FeRAM device shown in FIG. 4 comprises a plurality of word lines WL0 to WL3, a plurality of plate lines PL0 and PL1, and a plurality of bit lines BL0 to BL3. Each of these lines is connected to a memory cell. The FeRAM device further comprises a sense amplifier 10. Each of the bit lines BL0 to BL3 is connected to this sense amplifier 10. This sense amplifier 10 operates according to a sense amplifier activation signal SAE.

The memory cell M0 contained in the FeRAM device is constituted from the selection transistor T0 and ferroelectric capacitor C0; similarly, the memory cell M1 is constituted from the selection transistor T1 and ferroelectric capacitor C1. The main current path (channel) of this selection transistor T0 and the ferroelectric capacitor C0 are connected in series between the bit line BL0 and the plate line PL0, in order from the side of the bit line BL0, and the control electrode (gate electrode) of the selection transistor T0 is connected to the word line WL0. The main current path of the selection transistor T1 and the ferroelectric capacitor C1 are connected in series between the bit line BL1 and the plate line PL0, in order from the side of the bit line BL1, and the control electrode of the selection transistor T1 is connected to the word line WL1. NMOS transistors are used as these selection transistors T0 and T1.

The FeRAM device further comprises a floating control line EQ0 and transistors T4 and T5 for floating control. The main current paths of each of these transistors T4 and T5 are connected in series between the bit lines BL0 and BL1. The point of connection between these main current paths is connected to a ground terminal GND. Each of the control electrodes of the transistors T4 and T5 is connected to the control line EQ0.

Each of the bit lines BL0 to BL3 is connected to the respective bit line capacitance variation devices 14a, 14b, 14c, and 14d. These bit line capacitance variation devices 14a through 14d vary the bit line capacitance according to the bit line potentials V0 and V1. In this embodiment, each of these bit line capacitance variation devices 14a through 14d is constituted from a PMOS transistor T6 the gate electrode of which is connected to a bit line. For example, the gate electrode of the PMOS transistor T6 contained in the bit line capacitance variation device 14a is connected to the bit line BL0. The source electrode, drain electrode, and substrate of this transistor T6 are connected to a power supply terminal Vcc for supply of the power supply voltage Vcc. In this way, the PMOS transistors T6 are used as P-type MOS capacitors.

The PMOS transistor T6 is designed such that eq. (1) relating the threshold voltage Vt of the PMOS transistor T6 and the bit line potentials V0 and V1 obtains.

$$-|Vcc-V0|<Vt<-|Vcc-V1| \quad (1)$$

Figure 5:
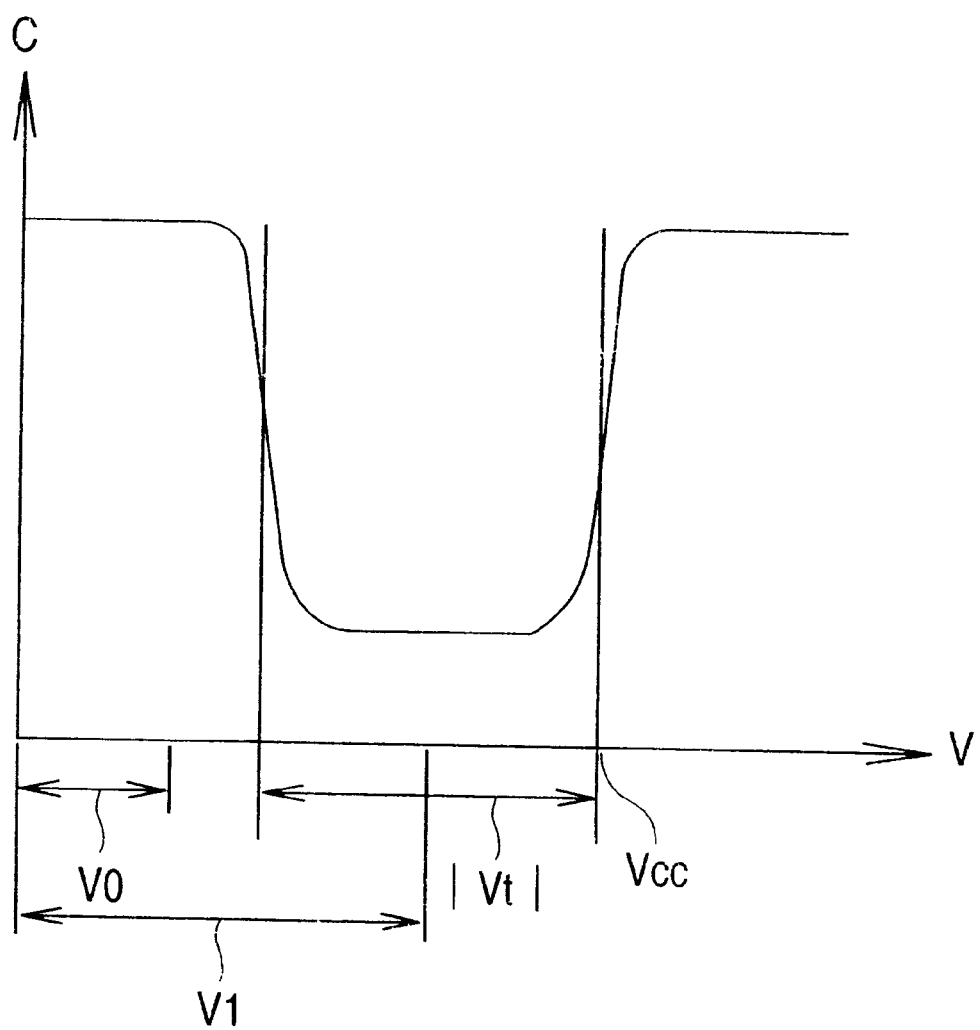
FIG. 5 is a graph showing the relation between the capacitance of a P-type MOS capacitor and the gate voltage.

FIG. 5 is a graph showing the relation between the capacitance of the P-type MOS capacitor configured from the transistor T6, and the gate voltage applied to the gate electrode of transistor T6. In the graph, the gate voltage is plotted along the horizontal axis, and the capacitance C of the MOS capacitor is plotted along the vertical axis. In FIG. 5, the flat band voltage Vfb of transistor T6 is approximated to zero (because the substrate potential is Vcc, in FIG. 5 Vfb=Vcc). From eq. (1), the MOS capacitor capacitance C shown in FIG. 5 decreases rapidly as the gate voltage V changes from V0 to V1. Hence the bit line capacitance changes accordingly as the bit line readout potential is V0 or V1.

Figure 6:
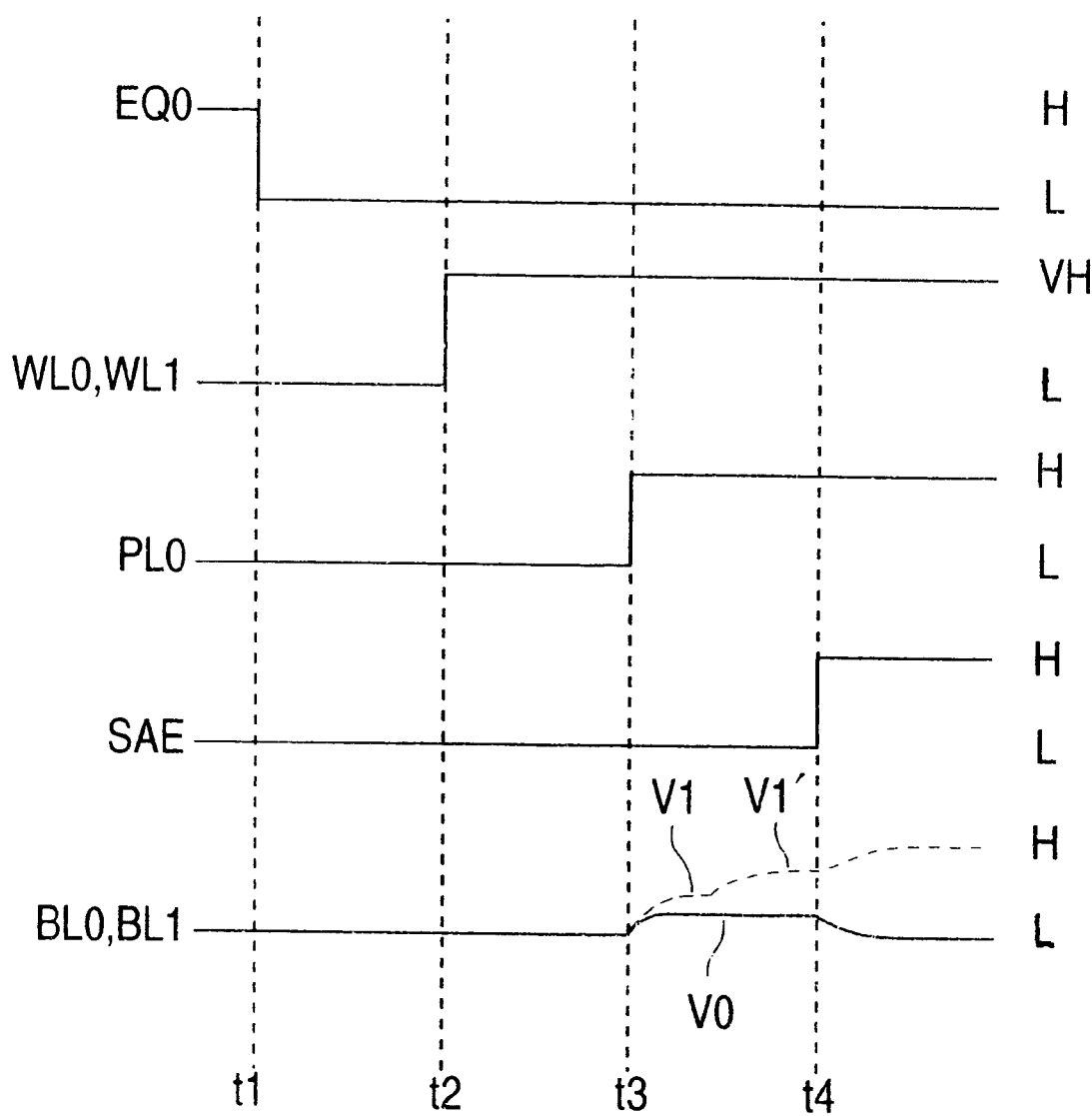
FIG. 6 is a drawing showing data readout operation of a ferroelectric memory device according to the first embodiment.

Below the operation of data readout from the FeRAM device of this embodiment is explained, referring to FIG. 6. FIG. 6 is a timing chart showing the operation of data readout from the FeRAM device of the first embodiment. In FIG. 6, the symbol "L" signifies ground potential, and the symbol "H" signifies the power supply voltage (Vcc).

At time t1, the floating control line EQ0 is set to level "L", and the bit lines BL0 and BL1 are put in a floating state.

Next, at time t2, a voltage VH is applied to the word lines WL0 and WL1, and the gates of the selection transistors T0 and T1 open. The applied voltage VH is higher than the power supply voltage Vcc by an amount equal to the threshold voltage Vt of the selection transistors.

Next, at time t3, the plate line PL0 is set to "H". Read potentials occur on the bit lines BL0 and BL1, via the ferroelectric capacitors C0 and C1 respectively. The capacitances of the capacitors C0 and C1 differ depending on the polarization direction, and so the read potentials occurring on the bit lines BL0 and BL1 become the potentials V0 or V1, according to the respective polarization directions. The bit line capacitance variation devices 14a and 14b connected to the bit lines BL0 and BL1 operate according to these read potentials, as shown in FIG. 7.

Figure 7:
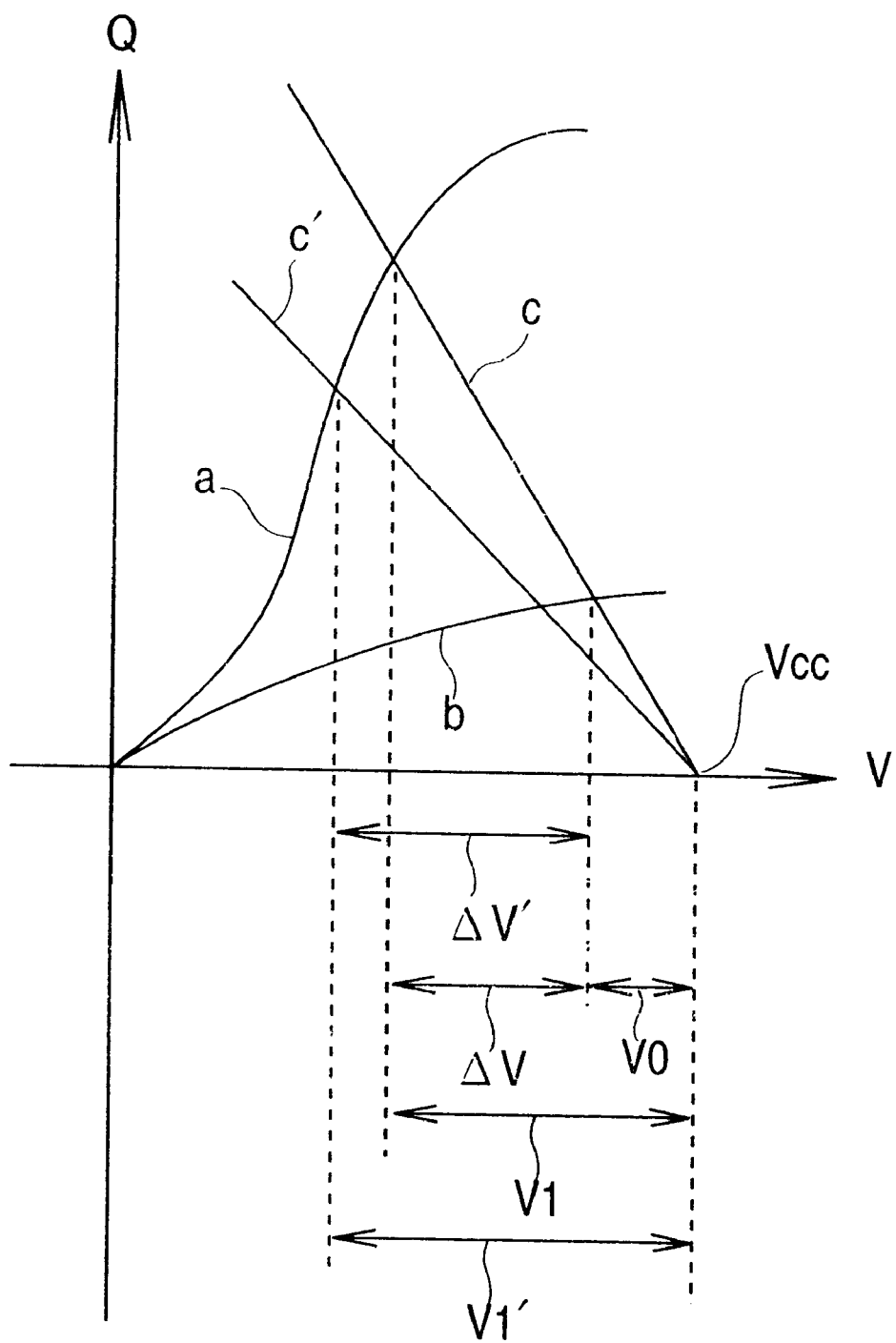
FIG. 7 is a graph serving to explain operation of the bit line capacitance variation devices.

FIG. 7 is a graph serving to explain operation of the bit line capacitance variation devices. In the graph, the voltage V applied to the ferroelectric capacitor is plotted along the horizontal axis, and the charge Q on the ferroelectric capacitor is plotted along the vertical axis. In the graph, the curve a represents the change in charge when data "1" is read. The curve b represents the change in charge when data "0" is read. The straight line c represents the load line; its gradient is determined by the value of the bit line capacitance Cb. The load line c and the horizontal axis intersect at the power supply voltage Vcc. The difference V1 between the voltage at the point of intersection of the load line c and curve a, and the power supply voltage Vcc, corresponds to the bit line potential when data "1" is read out. The difference V0 between the voltage at the point of intersection of the load line c and curve b, and the power supply voltage Vcc, corresponds to the bit line potential when data "0" is read out.

For example, as explained with reference to FIG. 5, when a readout potential V1 occurs on bit line BL1, the capacitance of the MOS capacitor contained in the bit line capacitance variation device 14b is reduced. Hence the bit line capacitance variation device 14b reduces to Cb1 (the gradient of the straight line c' in FIG. 7) the capacitance of the bit line BL1. As a result, the readout potential V1 of the bit line BL1 increases to V1' (the difference between the voltage at the intersection of curve a and straight line c' in FIG. 7, and the power supply voltage Vcc). Hence the difference ΔV' in readout potentials (the difference between V1' and V0) is increased compared with the readout potential difference ΔV for the case in which no bit line capacitance variation device is provided (the difference between V1 and V0), and so the read margin is increased.

Next, at time t4, the sense amplifier activation signal SAE is set to "H", and the sense amplifier 10 is activated. The sense amplifier 10 detects the difference in the read potentials occurring on the bit lines BL0 and BL1, and amplifies the potentials to ground potential and to the power supply potential Vcc respectively. These potentials correspond to a logical "0" and "1" respectively after reading.

As explained above, by means of the bit line capacitance variation devices of this embodiment, bit line capacitances can be changed according to bit line potentials, to increase the read margin. As a result, read errors are reduced.

Further, because divergence in the threshold voltages Vt of transistors T6 is markedly smaller than divergence in the characteristics of ferroelectric materials, stable operation is made possible.

Also, because PMOS transistors are formed on top of an N-type well layer, there is the further advantage that, by changing the potential of this well layer, a degree of Vt adjustment is possible.

Second Embodiment

Figure 8:
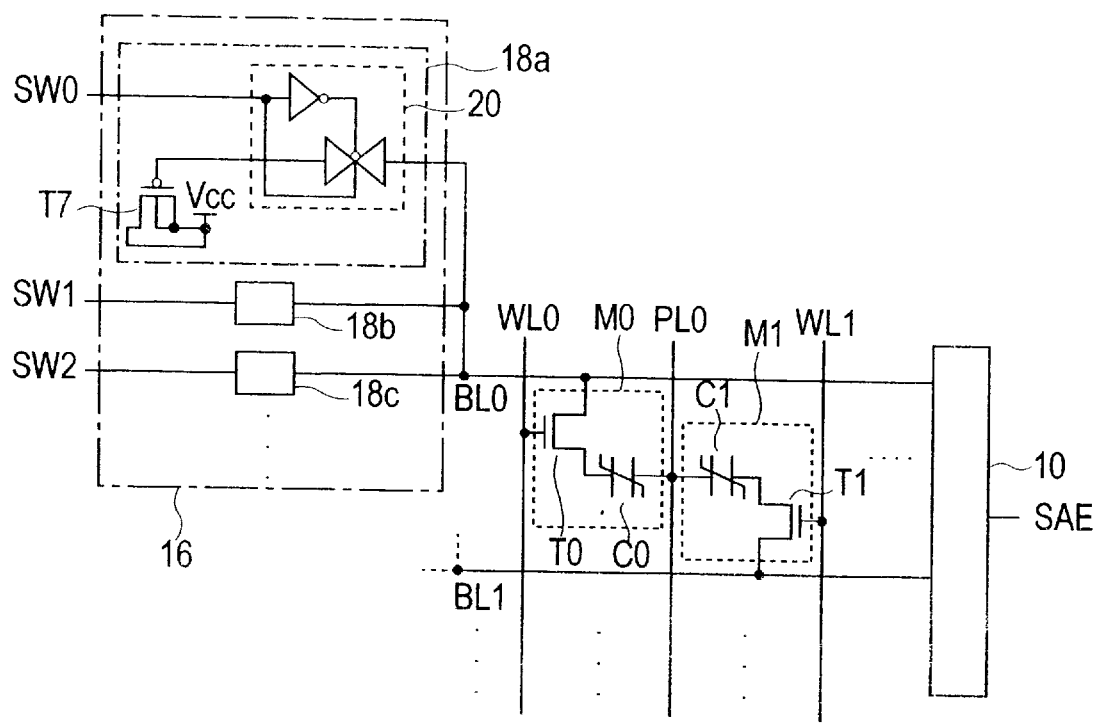
FIG. 8 is a drawing showing the configuration of a ferroelectric memory device of a second embodiment of this invention.

FIG. 8 is a circuit diagram showing the configuration of a ferroelectric memory (FeRAM) device according to a second embodiment. In FIG. 8, the configuration of the principal components of the FeRAM device is shown; some of the word lines, plate lines, bit lines, memory cells, and other components are omitted. Compared with the configuration shown in FIG. 4 and explained in the first embodiment, the FeRAM device shown in FIG. 8 differs in the bit line capacitance variation device parts. Hence the bit line capacitance variation devices are explained below, and an explanation of aspects of the embodiment that are similar is omitted.

In the FeRAM device shown in FIG. 8, respective bit line capacitance variation devices 16 are connected to each of the bit lines BL0 to BL3 (the bit line capacitance variation devices connected to bit lines BL1 to BL3 are not shown). The bit line capacitance variation devices 16 change the bit line capacitances according to the bit line potential V0 or V1. In this embodiment, a bit line capacitance variation device 16 comprises one or a plurality of variable elements. Below an explanation is given for the example of a bit line capacitance variation device 16 connected to bit line BL0.

As shown in FIG. 8, the bit line capacitance variation device 16 connected to bit line BL0 comprises a plurality of variable elements 18a, 18b, 18c, . . . These variable elements each comprise a switch 20 connected to the bit line BL0, and a PMOS transistor T7 the gate electrode of which is connected to the bit line BL0 via the switch 20, and used as a P-type MOS capacitor. The source electrode, drain electrode and substrate of this PMOS transistor T7 are each connected to a power supply terminal Vcc, so that this PMOS transistor T7 is used as a P-type MOS capacitor. The threshold voltage Vt of this PMOS transistor T7 satisfies the relation of eq. (1) above.

In this embodiment, the above-mentioned switch 20 comprises a CMOS transfer gate. The variable elements 18a, 18b, 18c, . . . respectively comprise input terminals SW0, SW1, SW2, . . . , and the above-mentioned switch 20 is controlled to turn on and off by the power supply voltage Vcc input to these input terminals SW0, SW1, SW2, . . . For example, when the power supply voltage Vcc is applied to the input terminal SW0 of the variable element 18a, the switch 20 of the variable element 18a is turned on. As a result, the gate electrode of the transistor T7 contained in the variable element 18a and the bit line BL0 enter a conducting state, and the variable element 18a enters a state of use. The variable element 18a performs bit line capacitance control for the bit line BL0, as explained with reference to FIG. 7 in the first embodiment.

If in addition to the single variable element 18a, other variable elements 18b, 18c, . . . are also put into a state of use, the variable range of the capacitance of the bit line BL0 can be increased compared with the case in which only the variable element 18a is used. In this way, by means of the switch 20 the number of variable elements to be used can be selected electrically, so that even after manufacture of the FeRAM device it is possible to adjust the amount of variation of the bit line capacitance to an appropriate value in accordance with the ferroelectric material characteristics.

The data readout operation for the FeRAM device of this embodiment is the same as the readout operation explained with reference to FIG. 6 in the first embodiment, and so an explanation is omitted.

Third Embodiment

Figure 9:
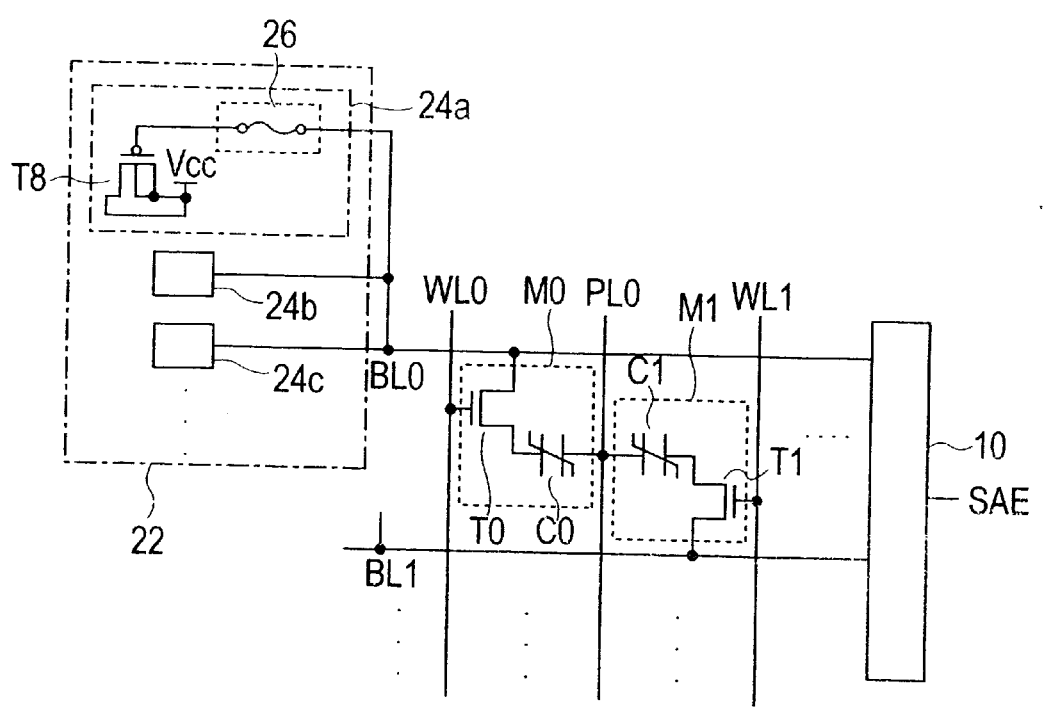
FIG. 9 is a drawing showing the configuration of a ferroelectric memory device of a third embodiment of this invention.

FIG. 9 is a circuit diagram showing the configuration of a ferroelectric memory (FeRAM) device according to a third embodiment. In FIG. 9, the configuration of the principal components of the FeRAM device is shown; some of the word lines, plate lines, bit lines, memory cells, and other components are omitted. Compared with the configuration shown in FIG. 4 and explained in the first embodiment, the FeRAM device shown in FIG. 9 differs in the bit line capacitance variation device parts. Hence the bit line capacitance variation devices are explained below, and an explanation of aspects of the embodiment that are similar is omitted.

In the FeRAM device shown in FIG. 9, respective bit line capacitance variation devices 22 are connected to each of the bit lines BL0 to BL3 (the bit line capacitance variation devices connected to bit lines BL1 to BL3 are not shown). The bit line capacitance variation devices 22 change the bit line capacitances according to the bit line potential V0 or V1. In this embodiment, a bit line capacitance variation device 22 is constituted from one or a plurality of variable elements. Below an explanation is given for the example of a bit line capacitance variation device 22 connected to bit line BL0.

As shown in FIG. 9, the bit line capacitance variation device 22 connected to bit line BL0 comprises a plurality of variable elements 24a, 24b, 24c, . . . These variable elements are each constituted from a switch 26 connected to the bit line BL0, and a PMOS transistor T8 the gate electrode of which is connected to the bit line BL0 via the switch 26, and used as a P-type MOS capacitor. The source electrode, drain electrode and substrate of this PMOS transistor T8 are each connected to a power supply terminal Vcc, so that this PMOS transistor T8 is used as a P-type MOS capacitor. The threshold voltage Vt of this PMOS transistor T8 satisfies the relation of eq. (1) above.

In this embodiment, the above-mentioned switch 26 is constituted from a metal fuse comprising the same metal material as the bit lines. When for example the switch 26 of the variable element 24a is turned on, the gate electrode of the transistor T8 contained in the variable element 24a and the bit line BL0 enter a conducting state, and the variable element 24a enters a state of use. The variable element 24a performs bit line capacitance control for the bit line BL0, as explained with reference to FIG. 7 in the first embodiment. In this way, similarly to the second embodiment, by turning the switch 26 on and off the number of variable elements used for bit line capacitance control can be adjusted. Hence even after manufacture of the FeRAM device it is possible to adjust the amount of variation of the bit line capacitance to an appropriate value in accordance with the ferroelectric material characteristics.

However, the switches 26 of this embodiment cannot be controlled electrically, as can the switches 20 of the second embodiment. That is, the metal fuses contained in the switches of variable elements that are not to be used must be severed in advance by, for example, focused ion beam (FIB) treatment or other means. Because such physical processing is necessary, some labor is required compared with the switches 20 of the second embodiment.

On the other hand, compared with the switches 20 of the second embodiment, the switches 26 of this embodiment have the advantage of requiring a smaller area.

The data readout operation for the FeRAM device of this embodiment is the same as the readout operation explained with reference to FIG. 6 in the first embodiment, and so an explanation is omitted.

Fourth Embodiment

Figure 10:
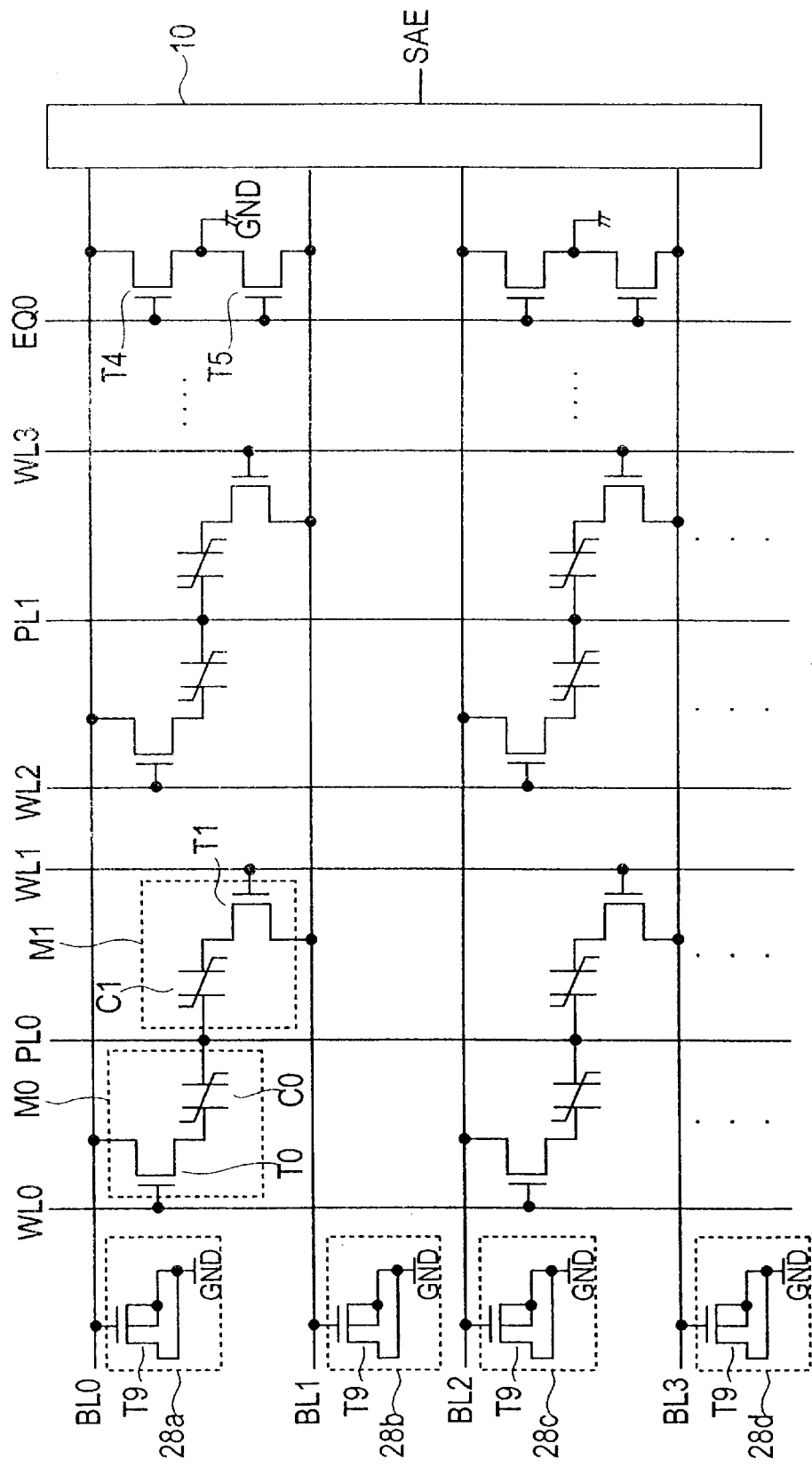
FIG. 10 is a drawing showing the configuration of a ferroelectric memory device of a fourth embodiment of this invention.

FIG. 10 is a circuit diagram showing the configuration of a ferroelectric memory (FeRAM) device according to a fourth embodiment. In FIG. 10, the configuration of the principal components of the FeRAM device is shown; some of the word lines, plate lines, bit lines, memory cells, and other components are omitted. Compared with the configuration shown in FIG. 4 and explained in the first embodiment, the FeRAM device shown in FIG. 10 differs in the bit line capacitance variation device parts. Hence the bit line capacitance variation devices are explained below, and an explanation of aspects of the embodiment that are similar is omitted.

As shown in FIG. 10, respective bit line capacitance variation devices 28a, 28b, 28c and 28d are connected to each of the bit lines BL0 to BL3. These bit line capacitance variation devices 28a to 28d change the bit line capacitances according to the bit line potential V0 or V1. In this embodiment, each of these bit line capacitance variation devices 28a to 28d is constituted from an NMOS transistor T9 the gate electrode of which is connected to the bit line. For example, the gate electrode of the NMOS transistor T9 contained in the bit line capacitance variation device 28a is connected to bit line BL0. The source electrode, drain electrode, and substrate of this transistor T9 are connected to a ground terminal GND. In this way, the NMOS transistors T9 are used as N-type MOS capacitors.

The NMOS transistor T9 is designed such that the relation of eq. (2) obtains between the flat band voltage Vfb of the NMOS transistor T9, and the bit line potentials V0 and V1.

$$V0 < Vfb < V1 \qquad (2)$$

Figure 11:
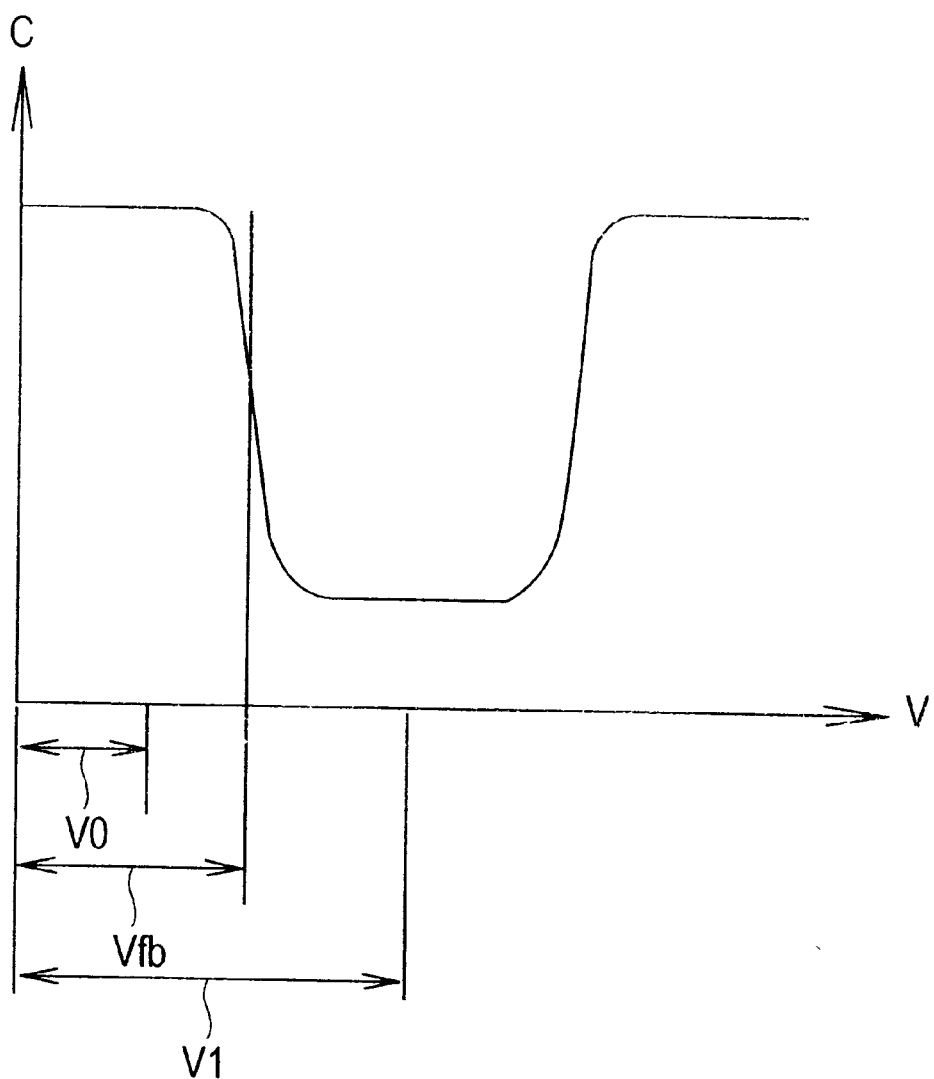
FIG. 11 is a graph showing the relation between the capacitance of an N-type MOS capacitor and the gate voltage.

FIG. 11 is a graph showing the relation between the capacitance of the N-type MOS capacitor configured from the transistor T9, and the gate voltage applied to the gate electrode of transistor T9. In the graph, the gate voltage V is plotted along the horizontal axis, and the capacitance C of the MOS capacitor is plotted along the vertical axis. From eq. (2), the MOS capacitor capacitance C shown in FIG. 11 decreases rapidly as the gate voltage V changes from V0 to V1. Hence the bit line capacitance changes accordingly as the bit line readout potential is V0 or V1.

Below the operation of data readout from the FeRAM device of this embodiment is explained. Readout operations of the FeRAM device of this embodiment are essentially the same as the readout operation of the first embodiment, explained referring to FIG. 6 and FIG. 7. Hence the following explanation of readout operation refers to FIG. 6 and FIG. 7.

At time t1, the floating control line EQ0 is set to level "L", and the bit lines BL0 and BL1 are put in a floating state.

Next, at time t2, a voltage VH is applied to the word lines WL0 and WL1, and the gates of the selection transistors T0 and T1 open. The applied voltage VH is higher than the power supply voltage Vcc by an amount equal to the threshold voltage Vt of the selection transistors.

Next, at time t3, the plate line PL0 is set to "H". Read potentials occur on the bit lines BL0 and BL1, via the ferroelectric capacitors C0 and C1 respectively. The capacitances of the capacitors C0 and C1 differ depending on the polarization direction, and so the read potentials occurring on the bit lines BL0 and BL1 become the potentials V0 or V1, according to the respective polarization directions. The bit line capacitance variation devices 28a and 28b connected to the bit lines BL0 and BL1 operate according to these read potentials, as shown in FIG. 7.

For example, as explained with reference to FIG. 11, when a read potential V1 occurs on bit line BL1, the capacitance of the MOS capacitor contained in the bit line capacitance variation device 28b is reduced. Hence the bit line capacitance variation device 28b reduces to Cb1 (the gradient of the straight line c' in FIG. 7) the capacitance of the bit line BL1. As a result, the readout potential V1 of the bit line BL1 increases to V1' (the difference between the voltage at the intersection of curve a and straight line c' in FIG. 7, and the power supply voltage Vcc). Hence the difference ΔV' in readout potentials (the difference between V1' and V0) is increased compared with the readout potential difference ΔV for the case in which no bit line capacitance variation device is provided (the difference between V1 and V0), and so the read margin is increased.

Next, at time t4, the sense amplifier activation signal SAE is set to "H", and the sense amplifier 10 is activated. The sense amplifier 10 detects the difference in the read potentials occurring on the bit lines BL0 and BL1, and amplifies the potentials to ground potential and to the power supply potential Vcc respectively. These potentials correspond to a logical "0" and "1" respectively after reading.

As explained above, by means of the bit line capacitance variation devices of this embodiment, bit line capacitances can be changed according to bit line potentials, to increase the read margin. As a result, read errors are reduced.

Further, because divergence in the flat band voltages Vfb of transistors T9 is markedly smaller than divergence in the characteristics of ferroelectric materials, stable operation is made possible.

Also, because NMOS transistors similar to the selection transistors and other memory transistors are used, the well and substrate can be used in common, and extra area for well separation is unnecessary.

Fifth Embodiment

Figure 12:
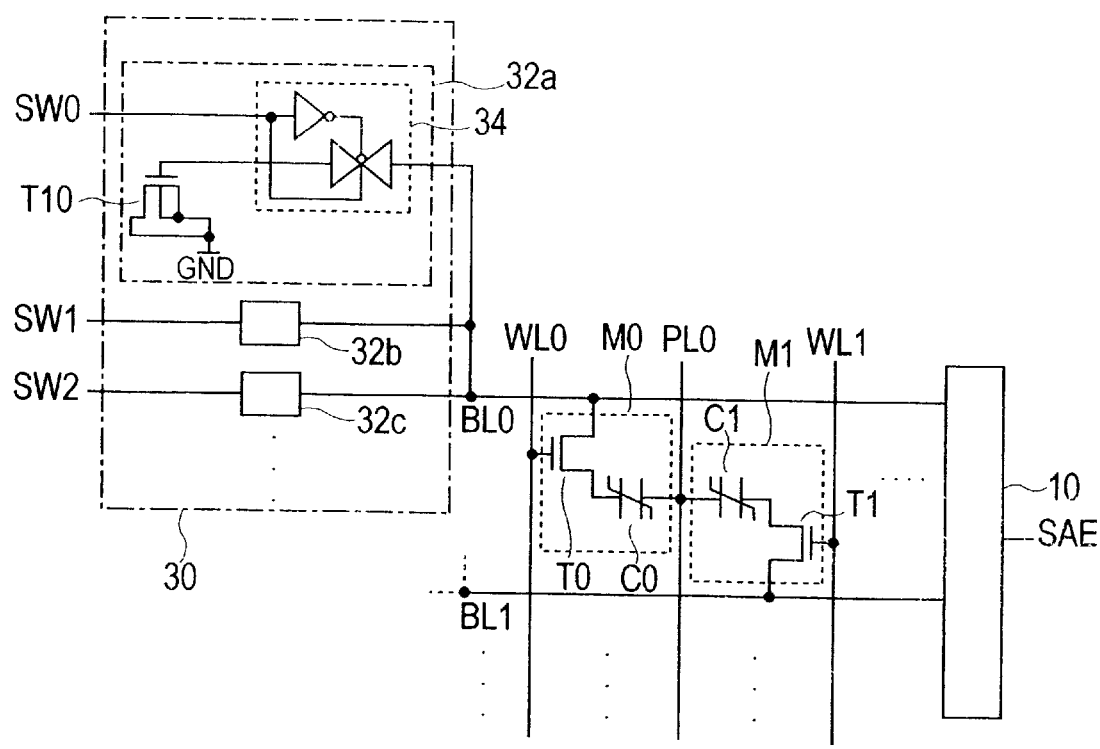
FIG. 12 is a drawing showing the configuration of a ferroelectric memory device of a fifth embodiment of this invention.

FIG. 12 is a circuit diagram showing the configuration of a ferroelectric memory (FeRAM) device according to a fifth embodiment. In FIG. 12, the configuration of the principal components of the FeRAM device is shown; some of the word lines, plate lines, bit lines, memory cells, and other components are omitted. Compared with the configuration shown in FIG. 4 and explained in the first embodiment, the FeRAM device shown in FIG. 12 differs in the bit line capacitance variation device parts. Hence the bit line capacitance variation devices are explained below, and an explanation of aspects of the embodiment that are similar is omitted.

In the FeRAM device shown in FIG. 12, respective bit line capacitance variation devices 30 are connected to each of the bit lines BL0 to BL3 (the bit line capacitance variation devices connected to bit lines BL1 to BL3 are not shown). The bit line capacitance variation devices 30 change the bit line capacitances according to the bit line potential V0 or V1. In this embodiment, a bit line capacitance variation device 30 comprises one or a plurality of variable elements. Below an explanation is given for the example of a bit line capacitance variation device 30 connected to bit line BL0.

As shown in FIG. 12, the bit line capacitance variation device 30 connected to bit line BL0 is constituted from a plurality of variable elements 32a, 32b, 32c, . . . These variable elements are each constituted from a switch 34 connected to the bit line BL0, and an NMOS transistor T10 the gate electrode of which is connected to the bit line BL0 via the switch 34, and used as an N-type MOS capacitor. The source electrode, drain electrode and substrate of this NMOS transistor T10 are each connected to a ground terminal GND, so that this NMOS transistor T10 is used as an N-type MOS capacitor. The flat band voltage Vfb of this NMOS transistor T10 satisfies the relation of eq. (2) above.

In this embodiment, the above-mentioned switch 34 comprises a CMOS transfer gate. The variable elements 32a, 32b, 32c, . . . respectively comprise input terminals SW0, SW1, SW2, . . . , and the above-mentioned switch 34 is turned on and off by the power supply voltage Vcc input to these input terminals SW0, SW1, SW2, . . . For example, when the power supply voltage Vcc is applied to the input terminal SW0 of the variable element 32a, the switch 34 of the variable element 32a is turned on. As a result, the gate electrode of the transistor T10 contained in the variable element 32a and the bit line BL0 enter a conducting state, and the variable element 32a enters a state of use. The variable element 32a performs bit line capacitance control for the bit line BL0, as explained with reference to FIG. 7 in the first embodiment.

If in addition to the single variable element 32a, other variable elements 32b, 32c, . . . are also put into a state of use, the variable range of the capacitance of the bit line BL0 can be increased compared with the case in which only the variable element 32a is used. In this way, by means of the switch 34 the number of variable elements to be used can be selected electrically, so that even after manufacture of the FeRAM device it is possible to adjust the amount of variation of the bit line capacitance to an appropriate value in accordance with the ferroelectric material characteristics.

The data readout operation for the FeRAM device of this embodiment is the same as the readout operation explained with reference to FIG. 6 in the first embodiment, and so an explanation is omitted.

Sixth Embodiment

Figure 13:
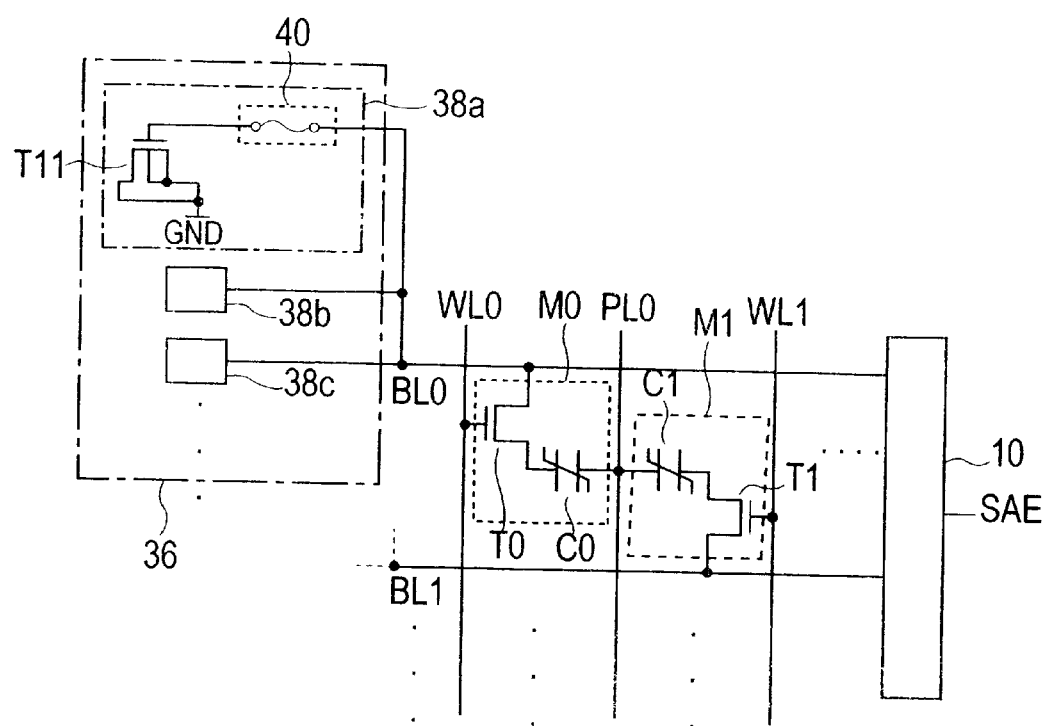
FIG. 13 is a drawing showing the configuration of a ferroelectric memory device of a sixth embodiment of this invention.
Figure 14:
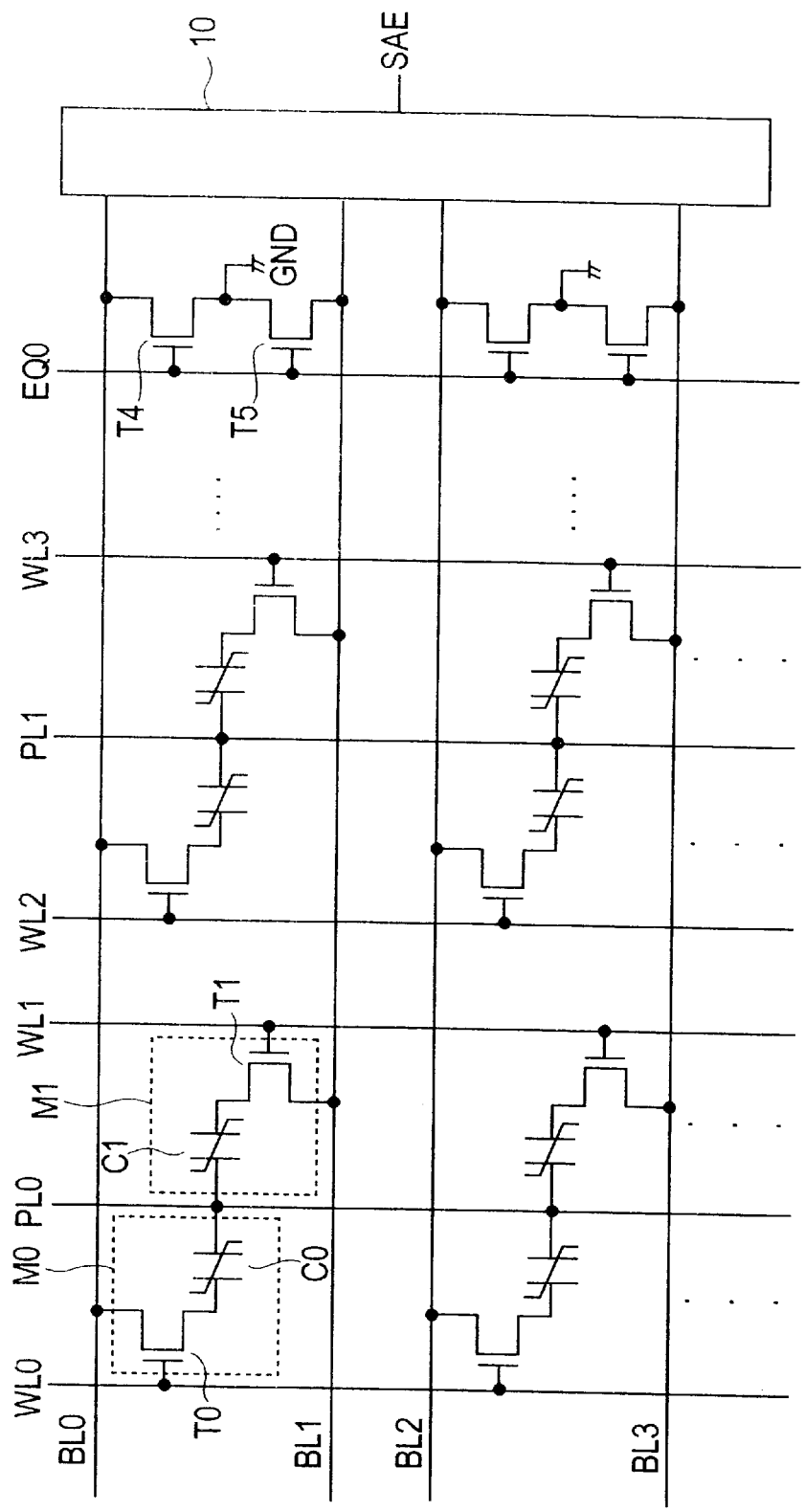
FIG. 14 is a drawing showing the configuration of a ferroelectric memory device of the prior art.
Figure 15:
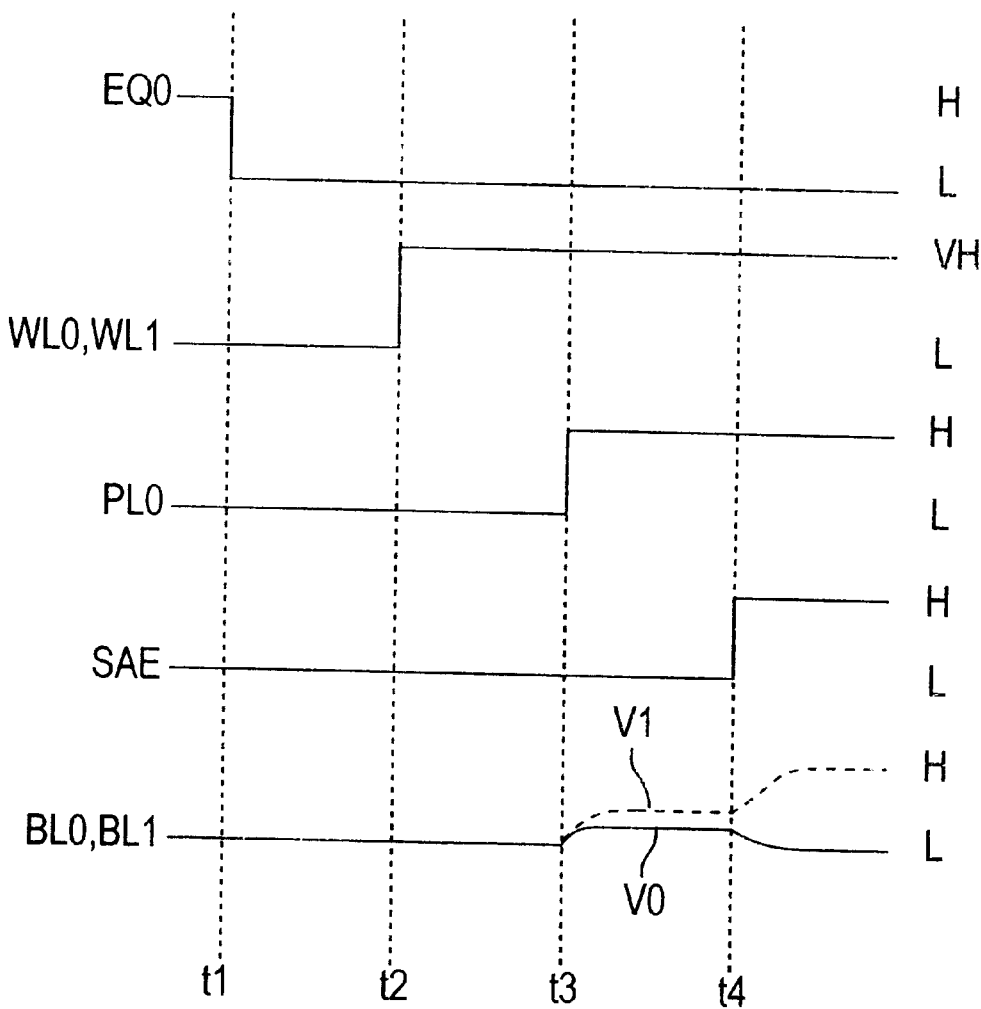
FIG. 15 is a drawing showing data readout operation of a ferroelectric memory device of the prior art; and, FIG. 16 is a drawing serving to explain problems.
Figure 16:
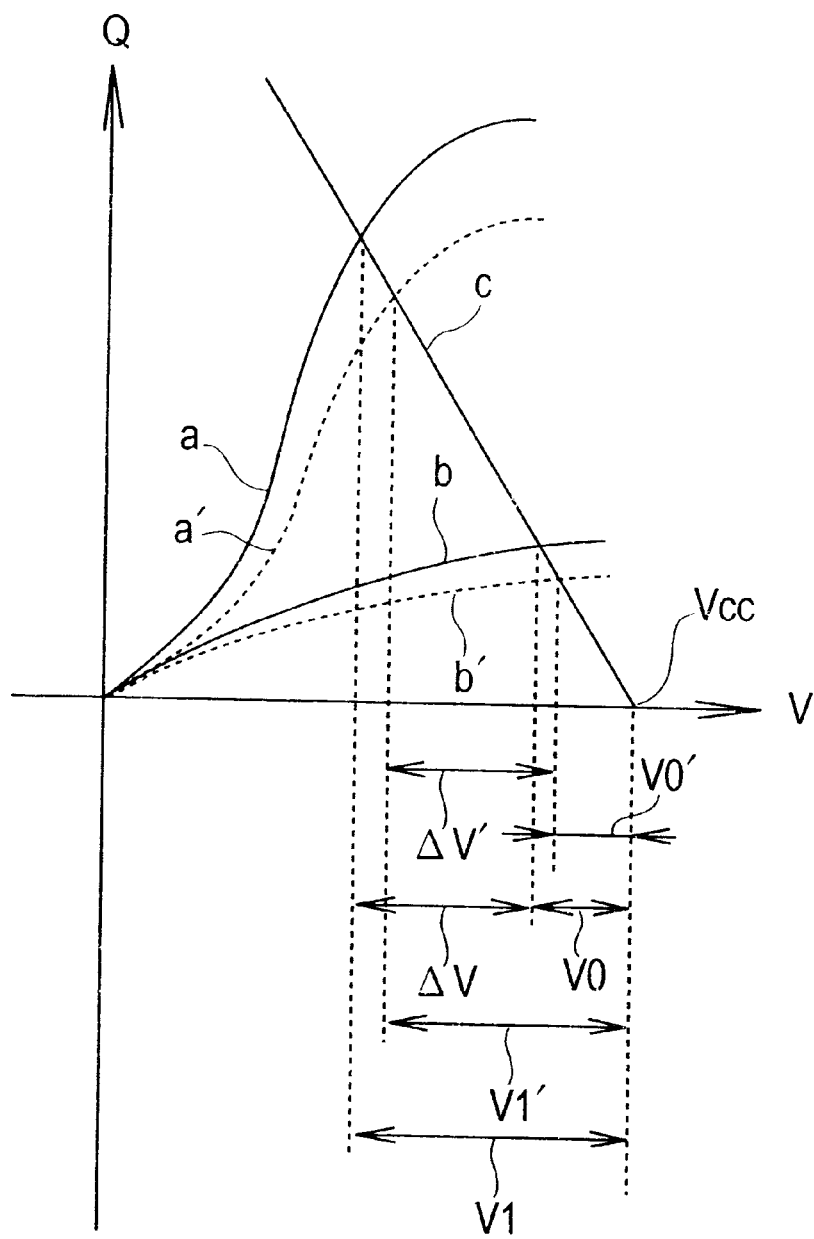

FIG. 13 is a circuit diagram showing the configuration of a ferroelectric memory (FeRAM) device according to a sixth embodiment. In FIG. 13, the configuration of the principal components of the FeRAM device is shown; some of the word lines, plate lines, bit lines, memory cells, and other components are omitted. Compared with the configuration shown in FIG. 4 and explained in the first embodiment, the FeRAM device shown in FIG. 13 differs in the bit line capacitance variation device parts. Hence the bit line capacitance variation devices are explained below, and an explanation of aspects of the embodiment that are similar is omitted.

In the FeRAM device shown in FIG. 13, respective bit line capacitance variation devices 36 are connected to each of the bit lines BL0 to BL3 (the bit line capacitance variation devices connected to bit lines BL1 to BL3 are not shown). The bit line capacitance variation devices 36 change the bit line capacitances according to the bit line potential V0 or V1. In this embodiment, a bit line capacitance variation device 36 comprises one or a plurality of variable elements. Below an explanation is given for the example of a bit line capacitance variation device 36 connected to bit line BL0.

As shown in FIG. 13, the bit line capacitance variation device 36 connected to bit line BL0 is constituted from a plurality of variable elements 38a, 38b, 38c, . . . These variable elements each comprise a switch 40 connected to the bit line BL0, and an NMOS transistor T11 the gate electrode of which is connected to the bit line BL0 via the switch 40, and used as an N-type MOS capacitor. The source electrode, drain electrode and substrate of this NMOS transistor T11 are each connected to a ground terminal GND, so that this NMOS transistor T11 is used as an N-type MOS capacitor. The flat band voltage Vfb of this NMOS transistor T11 satisfies the relation of eq. (2) above.

In this embodiment, the above-mentioned switch 40 comprises a metal fuse comprising the same metal material as the bit lines. When for example the switch 40 of the variable element 38a is turned on, the gate electrode of the transistor T11 contained in the variable element 38a and the bit line BL0 enter a conducting state, and the variable element 38a enters a state of use. The variable element 38a performs bit line capacitance control for the bit line BL0, as explained with reference to FIG. 7 in the first embodiment. In this way, similarly to the fifth embodiment, by turning the switch 40 on and off the number of variable elements used for bit line capacitance control can be adjusted. Hence even after manufacture of the FeRAM device it is possible to adjust the amount of variation of the bit line capacitance to an appropriate value in accordance with the ferroelectric material characteristics.

However, the switches 40 of this embodiment cannot be controlled electrically, as can the switches 34 of the fifth embodiment. That is, the metal fuses contained in the switches of variable elements that are not to be used must be severed in advance by, for example, focused ion beam (FIB) treatment or other means. Because such physical processing is necessary, some labor is required compared with the switches 34 of the fifth embodiment.

On the other hand, compared with the switches 34 of the fifth embodiment, the switches 40 of this embodiment have the advantage of requiring a smaller area.

The data readout operation for the FeRAM device of this embodiment is the same as the readout operation explained with reference to FIG. 6 in the first embodiment, and so an explanation is omitted.

As explained above, the ferroelectric memory device of this invention comprises bit line capacitance variation devices to change the bit line capacitance according to the bit line potential, so that the read margin is increased, and consequently read errors are reduced.

What is claimed is:

1. A ferroelectric memory device, comprising:

a plurality of word lines, a plurality of plate lines, a plurality of bit lines, and a plurality of memory cells, wherein said memory cells comprise ferroelectric capacitors and selection transistors; and said ferroelectric memory device further comprising:

a bit line capacitance variation device which changes the bit line capacitance according to the potential of said bit lines.

2. A ferroelectric memory device according to claim 1, wherein said bit line capacitance variation device comprises a PMOS transistor the gate electrode of which is connected to said bit line, and which is used as a P-type MOS capacitor.

3. A ferroelectric memory device according to claim 1, wherein said bit line capacitance variation device is constituted from either one or a plurality of variable elements, wherein said variable elements each comprise a switch connected to said bit line, and a PMOS transistor the gate electrode of which is connected to said bit line via said switch, and which is used as a P-type MOS capacitor.

4. A ferroelectric memory device according to claim 3, wherein said switches are constituted from CMOS transfer gates.

5. A ferroelectric memory device according to claim 3, wherein said switches are constituted from metal fuses.

6. A ferroelectric memory device according to claim 1, wherein said bit line capacitance variation device comprises an NMOS transistor the gate electrode of which is connected to said bit line, and which is used as an N-type MOS capacitor.

7. A ferroelectric memory device according to claim 1, wherein said bit line capacitance variation device is constituted from either one or a plurality of variable elements, wherein said variable elements each comprise a switch connected to said bit line, and an NMOS transistor the gate electrode of which is connected to said bit line via said switch, and which is used as a N-type MOS capacitor.

8. A ferroelectric memory device according to claim 7, wherein said switches are constituted from CMOS transfer gates.

9. A ferroelectric memory device according to claim 7, wherein said switches are constituted from metal fuses.

10. A ferroelectric memory device according to claim 1, wherein the main current paths of said selection transistors and said ferroelectric capacitors are connected in series between said bit lines and said plate lines, in order from the side of said bit lines, and the control electrodes of said selection transistors are connected to said word lines.

11. A ferroelectric memory device according to claim 1, wherein readout of data stored in said memory cells is performed by a sense amplifier which detects signals generated in response to the state of polarization of said ferroelectric capacitors.

* * * * *